US011486946B2

(12) United States Patent
Hu et al.

(10) Patent No.: US 11,486,946 B2
(45) Date of Patent: Nov. 1, 2022

(54) MAGNETICALLY COUPLED LOADING CHAMBER AND APPARATUS FOR IN SITU MAS NMR: OPERATING UNDER EITHER HIGH OR LOW PRESSURE

(71) Applicant: BATTELLE MEMORIAL INSTITUTE, Richland, WA (US)

(72) Inventors: Jian Z. Hu, Richland, WA (US); Nicholas R. Jaegers, Richmond, CA (US); Mark R. Townsend, Kennewick, WA (US); Mary Y. Hu, Richland, WA (US)

(73) Assignee: BATTELLE MEMORIAL INSTITUTE, Richland, WA (US)

( * ) Notice: Subject to any disclaimer, the term of this patent is extended or adjusted under 35 U.S.C. 154(b) by 277 days.

(21) Appl. No.: 17/072,617

(22) Filed: Oct. 16, 2020

(65) Prior Publication Data
US 2021/0199737 A1 Jul. 1, 2021

Related U.S. Application Data

(60) Provisional application No. 62/916,599, filed on Oct. 17, 2019.

(51) Int. Cl.
*G01R 33/30* (2006.01)
*B01L 3/00* (2006.01)
*B01L 9/00* (2006.01)
*G01R 33/46* (2006.01)

(52) U.S. Cl.
CPC ............ *G01R 33/307* (2013.01); *B01L 3/508* (2013.01); *B01L 9/00* (2013.01); *G01R 33/305* (2013.01); *G01R 33/46* (2013.01); *B01L 2200/026* (2013.01); *B01L 2300/0832* (2013.01)

(58) Field of Classification Search
CPC .... G01R 33/307; G01R 33/305; G01R 33/46; B01L 3/508; B01L 9/00; B01L 2200/026; B01L 2300/0832; B01L 2200/0689; B01L 2400/0605
See application file for complete search history.

(56) References Cited

U.S. PATENT DOCUMENTS 8,692,548 B2 * 4/2014 Hoyt .................... G01R 33/307
324/307
9,835,698 B2 * 12/2017 Hoyt .................... G01R 33/305

FOREIGN PATENT DOCUMENTS

CN 112649458 A * 4/2021 ............... G01N 1/04

OTHER PUBLICATIONS

English Translation of foreign Reference CN-112649458-A (Year: 2021).*

* cited by examiner

*Primary Examiner* — G. M. A Hyder
(74) *Attorney, Agent, or Firm* — Derek H. Maughan

(57) ABSTRACT

A sample chamber holder for MAS-NMR capable of operating at both low and high pressures. In one example the sample chamber holder is made up of a sample holder body defining a sample chamber therein, a connector configured to operatively statically hold an in situ rotor within the sample chamber; a coupler configured to operatively connect the sampler holder body to a magnetically coupled rotation member. The magnetically coupled rotation member is configured to engage and rotate a sealing cap from an NMR rotor in such a way so as to allow an NMR cap to be alternatively opened or sealed in-situ while the NMR rotor remains statically positioned in an NMR device.

17 Claims, 3 Drawing Sheets

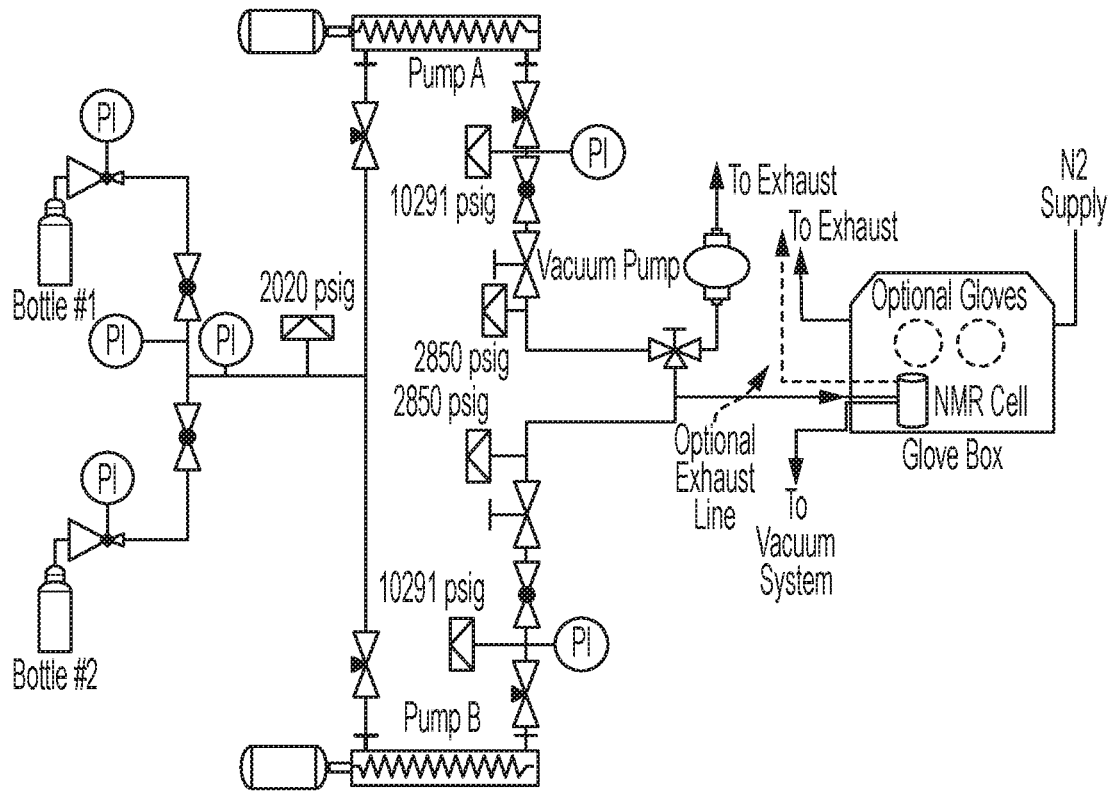
FIG. 3
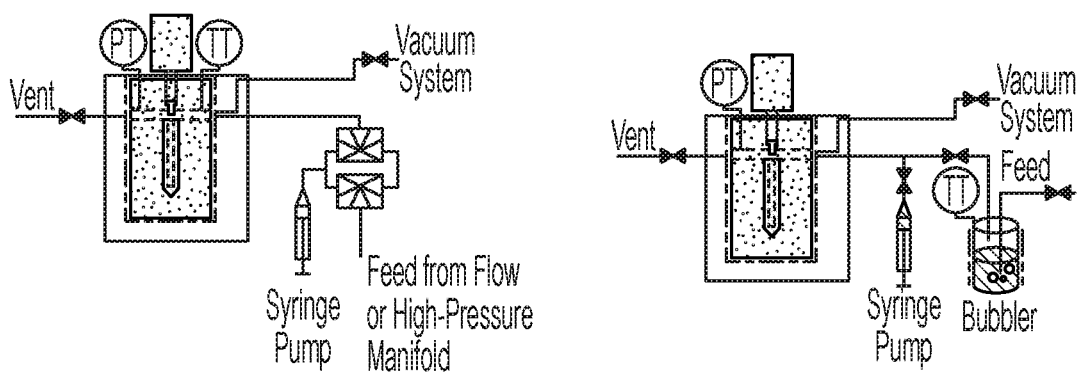
FIG. 4
FIG. 5

MAGNETICALLY COUPLED LOADING CHAMBER AND APPARATUS FOR IN SITU MAS NMR: OPERATING UNDER EITHER HIGH OR LOW PRESSURE

PRIORITY

This application claims priority from U.S. provisional patent application No. 62/916,599 entitled Magnetically Coupled Loading Chamber and Apparatus for In Situ MAS-NMR operating under either High or Low Pressure filed by the same inventors on Oct. 17, 2019. The contents of which are incorporated by reference in their entirety.

STATEMENT AS TO RIGHTS TO DISCLOSURES MADE UNDER FEDERALLY-SPONSORED RESEARCH AND DEVELOPMENT

This invention was made with Government support under Contract DE-AC0576RL01830 awarded by the U.S. Department of Energy. The Government has certain rights in the invention.

BACKGROUND

Field of the Disclosure

The disclosure generally relates to research tool and analytical instruments more particularly to instruments utilized in performing magic angle spinning nuclear mass resolution spectroscopy (MAS NMR).

Background Information

When performing MAS NMR in situ sample analysis on a wide variety of specimens has been hampered by an inability to maintain samples under vacuum and at low pressures. In addition, there is difficulty in being able to load specimens under low pressure and perform analysis of them under higher pressures or temperatures. The existing devices for performing MAS NMR simply lack have proven to have various faults and failings in this regard. While a variety of attempts have been made, there are presently no commercially available devices that overcome these failings.

In response to this need a device was created with the intent to fill the gaps left in the prior art and provide a solution for advancing the technology. The present disclosure provides a description of a device that has the capability of maintaining seal under vacuum and enables the preparation of samples at high or low pressures which is an advancement over complementary technologies (i.e. U.S. Pat. Nos. 8,692,548 and 9,835,698). The chamber may also be externally heated (e.g. via hot plate and/or heating tape) for enhanced control over the temperature and pressure of sample preparation. Gases can also be introduced through any of the inlets/outlets through a flow-style manifold, high pressure manifold, or vacuum manifold system. These features provide a substantial advantages over the art in the field.

Additional advantages and novel features of the present disclosure will be set forth as follows and will be readily apparent from the descriptions and demonstrations set forth herein. Accordingly, the following descriptions of the present disclosure should be seen as illustrative of the disclosure and not as limiting in any way.

SUMMARY

The present description provides a description of a sample chamber holder for MAS-NMR capable of operating at both low and high pressures. In one example the sample chamber holder is made up of a sample holder body defining a sample chamber therein, a connector configured to operatively statically hold an in situ rotor within the sample chamber; a coupler configured to operatively connect the sampler holder body to a magnetically coupled rotation member. The magnetically coupled rotation member is configured to engage and rotate a sealing cap from an NMR rotor in such a way so as to allow an NMR cap to be alternatively opened or sealed in-situ while the NMR rotor remains statically positioned in an NMR device.

In one example, the magnetically coupled rotation member includes a magnetically-coupled driver with a cylindrical magnet that maintains a constant preselected pressure within the sample chamber. In another arrangement the sample chamber holder includes at least one additional set of magnets positioned around an outer circumference of the chamber. Preferably, these magnets are placed symmetrically around the outer circumference of the chamber. The positioning of these magnets is intended so that when outside magnet sets are manually rotated, an induced magnetic force inside the chamber makes an internal magnet rotate.

In some application the sample holder chamber is made up of an upper and a lower chamber bodies. Preferably, the lower body is configured to connect with a rotor holder and defines a void space for the gas atmosphere. The upper body is configured to connect to the lower body, preferably in a sealing connection. Viewing windows defined within the chamber body (upper or lower) are positioned and configured to enable observation of an NMR rotor cap while the NMR rotor cap is opened or closed.

The rotor holder is a stage that slides into the lower chamber body to hold the NMR rotor in place during cap manipulation and sample treatment. A securing mechanism, in one embodiment a number if set screws, secure the rotor holder in place.

The upper body of the chamber can be configured to define at least one entry port that enables passage of materials into and out of the chamber. Depending upon the needs of the user a number of items can be connected to these ports including pressure relief valves, thermocouples, gas flow manifolds, liquid inputs or other desired items. The upper body also defines a threaded hole adapted to allow passage for a cap screw-driver mechanism. Which allows access and manipulation of the NMR cap. A bit piece configured to fit and lock on to an NMR drive shaft may also be present.

In use, the NMR rotor is placed within the sample chamber holder and the chamber is sealed. Manipulating the gas composition (such as by purging, flowing, vacuum application, or pressurizing) can then take place and the NMR rotor may be unscrewed within the chamber by the magnetically-coupled cap screwdriver to allow the rotor interior to equilibrate with the chamber gas composition. This enables performing MAS NMR at high or low pressure conditions (e.g. 2,000 psig) or the maximum rating for internal pressure of the NMR rotor. This ability to maintain sealing under vacuum and prepare samples at low pressures and test them at a higher pressure is an advancement over complementary technologies. In addition to enabling variations in pressure, the chamber may also be externally heated (e.g. via hot plate and/or heating tape) for enhanced control over the temperature as well as pressure of the sample. The ability to introduce or remove gases provides additional advantages.

Various advantages and novel features of the present disclosure are described herein and will become further readily apparent to those skilled in this art from the following detailed description. In the preceding and following descriptions I have shown and described only the preferred embodiment of the disclosure, by way of illustration of the best mode contemplated for carrying out the disclosure. As will be realized, the disclosure is capable of modification in various respects without departing from the disclosure. Accordingly, the drawings and description of the preferred embodiment set forth hereafter are to be regarded as illustrative in nature, and not as restrictive.

DETAILED DESCRIPTION OF THE DRAWINGS

FIG. 3 shows a schematic view of an embodiment of the vessel in one arrangement

FIGS. 4 and 5 show representative schematics of gas and vacuum systems coupled with the heated chamber.

DETAILED DESCRIPTION OF THE INVENTION

The purpose of the foregoing summary and the following description is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the disclosure of the application, which is measured by the claims, nor is it intended to be limiting as to the scope of the disclosure in any way.

While the contents herein will be centered on its application for magic angle spinning (MAS) NMR sample preparation however, this example is illustrative only and the attached teachings and designs may be alternatively applied in a number of applications. The loading chamber can be used to carefully control the desired internal chemical compositions. Charged with gases and vapors the chamber is equipped with inlets/outlets which can be connected to items having a variety of features such as inlet materials, pressure relief devices, pressure gauges, thermocouples, one or more viewing windows, holders for NMR rotors, and a magnetically-coupled cap screw driver that substantially simplifies the loading process over previous designs.

Figure 1:
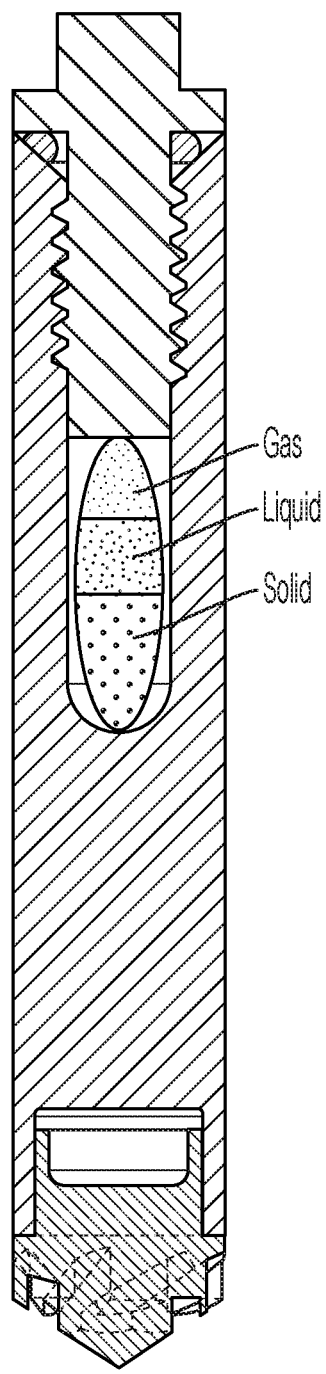
FIG. 1 shows a cross sectional cut away view of an in situ NMR rotor depicting three-phase sample retention.

FIGS. 1-5 show various views of the present invention and the associated embodiments of the device in use and application. Referring first to FIG. 1, FIG. 1 shows a cut away view of an NMR sample chamber capable of having materials in liquid, gas or solid phases. In use, the NMR rotor is placed within the holder and the chamber is sealed. After manipulating the gas composition (such as by purging, flowing, vacuum application, or pressurizing), the NMR rotor may be unscrewed within the chamber by the magnetically-coupled cap screwdriver to allow the rotor interior to equilibrate with the chamber gas composition. Compositions may include vacuum conditions to high pressures, dictated by the relief device (e.g. 2,000 psig) or the maximum rating for internal pressure of the NMR rotor. The capability to maintain sealing under vacuum and prepare samples at low pressures is an advancement over complementary technologies. The chamber may also be externally heated (e.g. via hot plate and/or heating tape) for enhanced control over the temperature and pressure of sample preparation. The gases can be introduced through any of the three inlets/outlets through a flow-style manifold, high pressure manifold, or vacuum manifold system.

Figure 2:
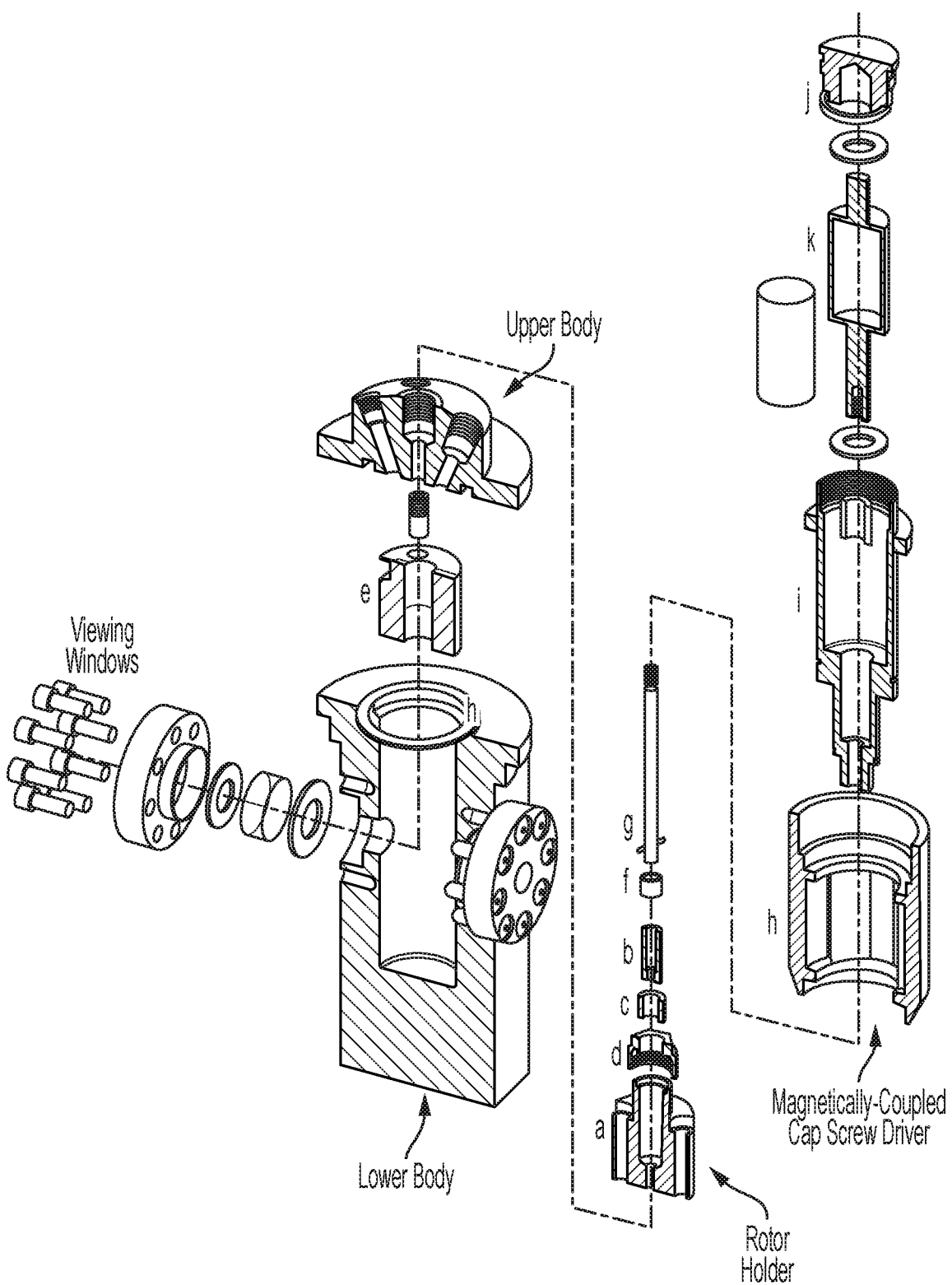
FIG. 2 shows a cut away assembly view of the principal components of the magnetically-coupled high/low pressure NMR loading vessel.

As shown in FIG. 2, the lower body of the sample chamber holder houses the rotor holder and void space for the gas atmosphere. In one embodiment it consists of a cylindrical-type stainless steel vessel which is flat on the bottom and rounded about the vertical axis. Two viewing windows are located on opposite sides of the body where the vertical section has been flattened. These quartz windows are sealed with rings on both sides and held in place by a flange with bolts threaded into the body.

These windows are positioned to enable the observation of the state of the NMR rotor cap during the screwing process. The upper chamber body possesses a lip to allow the top and bottom sections to be clamped together as well as a circular protrusion or indentation on the top, flat surface to provide a sealing surface with the upper section of the chamber. A rotor holder assembly includes a small stage that slides into the lower chamber body to hold the NMR rotor in place during cap manipulation and sample treatment. It consists of a cylindrical lower support with a centrally-drilled hold protruding downward from an extruded central cylinder. At the top of the lower surface and along the edge, two small screw holes (a) are present which contain screws with flattened edges and heads that slightly exceed the maximum diameter of the rotor holder. These screws are rotated once inside the lower chamber body to secure the rotor holder in place. A third threaded hole has been cut slightly farther inward on the same surface to allow a threaded rod to lift the rotor holder up and down into the lower chamber body.

The rotor can be inserted into the centrally-located hole on the rotor holder by placing it into a stainless steel sleeve (b) of the appropriate size for the rotor (customizable) and placing the sleeve into the centrally-located hole on the rotor holder. An O-ring will be placed on the lip at the top of the rotor holder, followed by a compression washer (c). A threaded nut (d) is the placed on top of these and tightened to ensure the rotor is firmly held in place the top of the rotor is visible.

The upper body of the chamber consists of several components anchored to a circular, upper body base. This base contains threaded entry ports that enable gas flow into and out of the chamber by various delivery methods. Five threaded, gasket-sealed and/or Teflon-wrapped entry ports (four depicted) are included that connect external sources to the chamber space: 1) a pressure relief device such as a relief valve or rupture disc set at 2000 psig, 2) a thermocouple to monitor the internal temperature of the chamber, 3) one port that includes a T-style union to monitor the pressure via pressure gauge and also serve as an inlet/outlet controlled by a needle valve or similar, 4) a splitter union to allow for 2 gas streams to serve as an inlet/outlet, each controlled by a needle valve or similar, and 5) a port which connects to the magnetically-coupled cap screw driver system.

The gas ports are connected to high-pressure, flow, or vacuum manifolds. The gas flow and thermocouple ports merge and are guided down into the lower body void space through the protruding cylinder (e) on the bottom of the upper body. This cylinder is sized appropriately to 1) allow for viewing of the NMR rotor top, and 2) minimize the void volume in the lower body void space.

The center of the upper body contains the threaded hole for the cap screw-driver mechanism. This externally-rotating cylinder that can be easily operated manually is magnetically coupled to an internally-rotating cylinder which protrudes into the chamber void and makes contact with the staged NMR rotor. Within this internal cylinder, a bit piece is fit and locked into the drive shaft to couple onto the rotor cap for threading/unthreading of the NMR rotor.

This bit piece is removable to accommodate a wide range of driving mechanisms (e.g. extruded hexagonal bit) and may be spring-loaded into the drive shaft with retaining screws or pins to minimize pressure on the NMR rotor. The bottom surface of the supper chamber contains a Teflon ring (h) that seats on the lower body sealing surface lip and is pressed on to the sealing surface by the body clamps. Two half-circular (arc) chamber body clamps serve the purpose of supplying force to the sealing surfaces of the lower and upper chamber bodies. The lower lip of the body clamps is preferably positioned below the lip of the lower body while the upper section of the body clamps should rest atop the upper body. The clamps consist of a latch section on each side of the half-circle to securely hold it in place with the other half-circle.

The top of each body clamp contains three large bolts which thread through the upper section of the clamp and press onto a vertically-moveable plate held onto the clamps by two freely moving bolts running through the top of each body clamp. Further threading the large bolts through the body clamps will press down on the plates and camp the upper and lower bodies together through force.

A magnetically-coupled capscrew driver improves upon previous designs whereby the cap may be threaded and unthreaded with ease, using only the hand for enhanced control and tactile response. Previous thrust/ball bearing models require a wrench to turn which is both less convenient and offers an opportunity to overtighten the rotor cap and break the sample holder. Further, the use of an O-ring to seal along the rotating axis may enable leakages to occur due to the motion of a shaft during high pressure. The magnetically-coupled design mitigates these issues. It consists of three cylindrical components. The outer-most cylindrical component is externally placed and consists of a hollow cylinder with two or more magnetic blades or similar bound to the internal walls. This is the component that is rotated by hand to drive the internal rod to thread the NMR rotor cap.

This piece rests along the upper section of the outside of the second cylinder where it is held in place by a lightly magnetic ball-bearing ring (or magnetic cylinders embedded into the cylinder) and capped on the top to maintain the second cylinder within (optional, not depicted). The second cylinder, also hollow, is threaded into the top center hold of the chamber upper body to seal the chamber and allow entry into the center of this second cylinder. The top of cylinder 2 is threaded to allow a high-pressure cap sealed with a Teflon ring to isolate the loading chamber from the atmosphere. Within this second cylinder, the third cylinder rests, suspended in the center with a small clearance space to minimize void. The upper part of this cylinder contains some variation of a magnetic field (blades, solid core, rings, etc.) positioned consistently with the first, outer cylinder to enable magnetic coupling. Below the magnetic section, in the lower section of this third cylinder, the radius is reduced and the lower portion of the second cylinder near the thread connecting to the chamber upper body.

The drive shaft passes through this threaded section and connects to the threaded lower part of cylinder 3. The external first and internal third cylinder are magnetically coupled such that a rotation in one will stimulate rotation in the other through the other cylinder. In practice, the outer cylinder (h) will be rotated by hand, which will turn the magnetically-coupled internal cylinder, and thus the drive shaft which will manipulate the NMR rotor cap. The rotating cap screw driver is completely contained within the chamber and sealed against leaks. In this way, no moving parts are relied upon as sealing surfaces and the force required to turn the cap is dramatically reduced, enabling fine control over the threading process.

This chamber design is a substantial improvement over alternatives due to the following features: The magnetically-coupled cap screw driver improves the operation of the vessel by: reducing the force required to rotate the cap screw driver which makes the device easier to work with and more tactilely sensitive, which results in savings of operational time and capital costs associated with overtightening the caps. The seal of the vessel is no longer dependent upon a rotating surface, which improves system reliability and safety. This preparation vessel enables the employment of finer control over the chemical environment of the samples. In particular, this vessel enables fine control over low-pressure applications and can be connected to a vacuum manifold in addition to high pressure and flow systems.

In a preferred embodiment the rotor holder and the engagement mechanisms are of modular design and adapted to various in situ rotor sizes, i.e., from 1.2 to 9.5 mm. The magnetically coupled loading and reaction device preferably include at least one fluid port operatively coupled to introduce fluids independently into the sample cell within the NMR rotor while allowing the monitoring and controlling of the internal pressure and temperature.

In use, the in situ NMR rotor can be sealed by introducing a quantity of sample into the in situ NMR rotor positioned within a low or high-pressure loading and reaction device, and sealing the sample within the in situ NMR rotor and reaction device at the designated pressure and temperature with a rotor cap operatively coupled to the sample cell by turning that cap with a magnetically-coupled rotation system, thereby sealing that valve. In use the pressure within the in situ NMR rotor can be less than ambient pressure, from ambient to 10-6 torr, or at significantly elevated pressures, from 1 atm to 1000 atm, and at variable temperatures from liquid N2 to 300° C.

In one use case, the NMR rotor is placed within the holder and the chamber is sealed. After manipulating the gas composition (such as by purging, flowing, vacuum application, or pressurizing) the NMR rotor may be unscrewed within the chamber by the magnetically-coupled cap screwdriver to allow the rotor interior to equilibrate with the chamber gas composition. Compositions may include vacuum conditions to high pressures, dictated by the relief device (e.g. 2,000 psig) or the maximum rating for internal pressure of the NMR rotor. The capability to maintain sealing under vacuum and prepare samples at low pressures is an advancement over complementary technologies (U.S. Pat. Nos 8,692,548; and 9,835,698). The chamber may also be externally heated (e.g. via hot plate and/or heating tape) for enhanced control over the temperature and pressure of sample preparation. The gases can be introduced through any of the three inlets/outlets through a flow-style manifold, high pressure manifold, or vacuum manifold system.

Additional descriptions of the component parts are described here after. Chamber Lower Body: The lower body of the chamber houses the rotor holder and void space for the gas atmosphere. It consists of a cylindrical type stainless steel vessel which is flat on the bottom and rounded about the vertical axis. Two viewing windows are located on opposite sides of the body where the vertical section has been flattened. These quartz windows are sealed with rings on both sides and held in place by a flange with 8 bolts threaded into the body. These windows are vertically positioned to enable the observation of the state of the NMR rotor cap during the screwing process. The top of the chamber body possesses a lip to allow the top and bottom sections to be clamped together as well as a circular protrusion or indentation on the top, flat surface to provide a sealing surface with the upper section of the chamber.

Rotor Holder: The rotor holder is a small stage that slides into the Lower Chamber Body to hold the NMR rotor in place during cap manipulation and sample treatment. It consists of a cylindrical lower support with a centrally-drilled hold protruding downward from an extruded central cylinder. At the top of the lower surface and along the edge, two small screw holes (a) are present which contain screws with flattened edges and heads that slightly exceed the maximum diameter of the Rotor Holder. These screws are rotated once inside the Lower Chamber Body to secure the Rotor holder in place. A third threaded hole has been cut slightly farther inward on the same surface to allow a threaded rod to lift the Rotor holder up and down into the Lower Chamber Body. The rotor can be inserted into the centrally-located hole on the Rotor Holder by placing it into a stainless steel sleeve (b) of the appropriate size for the rotor (customizable) and placing the sleeve into the centrally-located hole on the Rotor Holder. An O-ring will be placed on the lip at the top of the rotor holder, followed by a compression washer (c). A threaded nut (d) is the placed on top of these and tightened to ensure the rotor is firmly held in place the top of the rotor is visible.

Chamber Upper Body: The Upper Body of the chamber consists of several components anchored to a circular, Upper Body base. This base contains threaded entry ports that enable gas flow into and out of the chamber by various delivery methods. Five threaded, gasket-sealed and/or Teflon-wrapped entry ports (four depicted) are included that connect external sources to the chamber space. Exemplary items include: a pressure relief device such as a relief valve or rupture disc set at 2000 psig; a thermocouple to monitor the internal temperature of the chamber; a port that includes a T-style union to monitor the pressure via pressure gauge and also serve as an inlet/outlet controlled by a needle valve or similar; a splitter union to allow for 2 gas streams to serve as an inlet/outlet, each controlled by a needle valve or similar, and/or a port which connects to the Magnetically-coupled cap screw driver system. In some embodiments the gas ports are connected to high-pressure, flow, or vacuum manifolds.

The gas flow and thermocouple ports merge and are guided down into the Lower Body void space through the protruding cylinder (e) on the bottom of the Upper Body. This cylinder is sized appropriately to allow for viewing of the NMR rotor top, and minimize the void volume in the Lower Body void space. The center of the Upper Body contains the threaded hole for the cap screw driver mechanism. This externally-rotating cylinder that can be easily operated manually is magnetically coupled to an internally-rotating cylinder which protrudes into the chamber void and makes contact with the staged NMR rotor.

Within this internal cylinder, a bit piece (f) is fit and locked into the drive shaft (g) to couple onto the rotor cap for threading/unthreading of the NMR rotor. This bit piece is removable to accommodate a wide range of driving mechanisms (e.g. extruded hexagonal bit) and may be spring-loaded into the drive shaft with retaining screws or pins to minimize pressure on the NMR rotor. The bottom surface of the supper chamber contains a Teflon ring (h) that seats on the Lower Body sealing surface lip and is pressed on to the sealing surface by the Body Clamps. Chamber Body Clamps: Two half-circular (arc) Chamber Body Clamps serve the purpose of supplying force to the sealing surfaces of the Lower and Upper Chamber Bodies. The lower lip of the Body Clamps should be positioned below the lip of the Lower Body while the upper section of the Body Clamps should rest atop the Upper Body. The clamps consist of a latch section on each side of the half-circle to securely hold it in place with the other half-circle.

The top of each Body Clamp contains three large bolts which thread through the upper section of the clamp and press onto a vertically-moveable plate held onto the clamps by two freely moving bolts running through the top of each Body Clamp. Further threading the large bolts through the Body Clamps will press down on the plates and camp the Upper and Lower Bodies together through force. Magnetically-coupled cap screw driver: The magnetically-cap screw driver improves upon previous designs whereby the cap may be threaded and unthreaded with ease, using only the hand for enhanced control and tactile response. Previous thrust/ball bearing models require a wrench to turn which is both less convenient and offers an opportunity to overtighten the rotor cap and break the sample holder.

Further, the use of an O-ring to seal along the rotating axis may enable leakages to occur due to the motion of a shaft during high pressure. The magnetically-coupled design mitigates these issues. It consists of three cylindrical components. The outer-most cylindrical component (h) is externally placed and consists of a hollow cylinder with two or more magnetic blades or similar bound to the internal walls. This is the component that is rotated by hand to drive the internal rod (g) to thread the NMR rotor cap. This piece rests along the upper section of the outside of the second cylinder (i) where it is held in place by a lightly magnetic ball-bearing ring (or magnetic cylinders embedded into the cylinder 2) and capped on the top to maintain the second cylinder within.

The second cylinder (i), also hollow, is threaded into the top center hold of the Chamber Upper Body to seal the chamber and allow entry into the center of this second cylinder. The top of cylinder 2 is threaded to allow a high-pressure cap (j) sealed with a Teflon ring to isolate the loading chamber from the atmosphere. Within this second cylinder, the third cylinder (k) rests, suspended in the center with a small clearance space to minimize void. The upper part of this cylinder contains some variation of a magnetic field (blades, solid core, rings, etc.) positioned consistently with the first, outer cylinder to enable magnetic coupling. Below the magnetic section, in the lower section of this third cylinder, the radius is reduced and the lower portion of the second cylinder (i) near the thread connecting to the Chamber Upper Body. The drive shaft (g) passes through this threaded section and connects to the threaded lower part of cylinder 3 (k). The external first (h) and internal third cylinder (k) are magnetically coupled such that a rotation in one will stimulate rotation in the other through the other cylinder.

In practice, the outer cylinder (h) will be rotated by hand, which will turn the magnetically-coupled internal cylinder (k), and thus the drive shaft (g) which will manipulate the NMR rotor cap. The rotating cap screw driver is completely contained within the chamber and sealed against leaks. In this way, no moving parts are relied upon as sealing surfaces and the force required to turn the cap is dramatically reduced, enabling fine control over the threading process.

This chamber design provides a substantial improvement over alternatives including a magnetically-coupled cap screw driver improves the operation of the vessel by reducing the force required to rotate the cap screw driver which makes the device easier to work with and more tactilely sensitive, which results in savings of operational time and capital costs associated with overtightening the caps. The seal of the vessel is no longer dependent upon a rotating surface, which improves system reliability and safety. This preparation vessel enables the employment of finer control over the chemical environment of the samples. In particular, this vessel enables fine control over low-pressure applications and can be connected to a vacuum manifold in addition to high pressure and flow systems.

While various preferred embodiments of the disclosure are shown and described, it is to be distinctly understood that this disclosure is not limited thereto but may be variously embodied to practice within the scope of the following claims. From the foregoing description, it will be apparent that various changes may be made without departing from the spirit and scope of the disclosure as defined by the following claims.

What is claimed is:

1. A sample chamber holder for MAS-NMR capable of operating at both low and high pressures the sample chamber holder comprised of:
   a sample holder body defining a sample chamber therein,
   a connector configured to operatively statically hold an in situ rotor within the sample chamber;
   a coupler configured to operatively connect the sampler holder body to a magnetically coupled rotation member;
   the magnetically coupled rotation member configured to engage and rotate a sealing cap from an NMR rotor in such a way so as to allow an NMR cap to be alternatively opened or sealed in-situ while the NMR rotor remains statically positioned in an NMR device.

2. The sample chamber holder of claim 1 wherein the magnetically coupled rotation member includes a magnetically-coupled driver with a cylindrical magnet that maintains a constant preselected pressure within the sample chamber.

3. The sample chamber holder of claim 1 wherein the connector, coupler and rotation member are embodied in a magnetically coupled capscrew driver mechanism comprising three hollow nesting cylindrical components;
   a first hollow cylindrical component positioned external to the other two components;
   a second hollow cylindrical component adapted to fit within the first hollow cylindrical component;
   and a third hollow cylindrical component adapted to fit within the second hollow cylindrical component;
   an inner wall of the first cylindrical component having a magnetic mechanism configured to interact with a magnetic component of the third hollow cylindrical component so as to enable magnetic coupling, whereby rotation of the first hollow cylindrical component will cause rotation of a third hollow cylinder component, the first hollow cylindrical component also connected to a second hollow cylindrical component;
   the second hollow cylindrical component having a portion adapted for threaded connection with an upper body portion of a sample holder to allow coupling and sealing of the sample chamber to the sample chamber holder;
   the third hollow cylindrical component configured to rest suspended in the center of the second hollow cylindrical component, the magnetic coupling of the first and third hollow cylindrical components such that a rotation in one will stimulate rotation in the other through the other cylinder, each of the first and second hollow cylindrical components also adapted to receive and allow passage of a drive shaft therethrough, the third hollow cylindrical component having a portion adapted to connect to a drive shaft, whereby rotation of the first hollow cylindrical component will turn the magnetically-coupled internal third hollow cylindrical component and thus engage the drive shaft which will manipulate an NMR rotor cap.

4. The sample chamber holder of claim 3 wherein the sample holder body includes a lower body configured to connect with a rotor holder and defining a void space for the gas atmosphere, and an upper body configured to connect to the lower body and to the second hollow cylindrical component.

5. The sample chamber holder of claim 4 further comprising viewing windows defined within the chamber body, said windows positioned and configured to enable observation of an NMR rotor cap while the NMR rotor cap is opened or closed.

6. The sample chamber holder of claim 4 wherein the upper body and the lower body are adapted for sealing connection.

7. The sample chamber holder of claim 6 further comprising a rotor holder that slides into the lower chamber body to hold the NMR rotor in place during cap manipulation and sample treatment.

8. The sample chamber holder of claim 4 wherein the upper body of the chamber defines at least one entry port that enable passage of materials into and out of the chamber.

9. The sample chamber holder of claim 8 wherein a pressure relief device is connected to at least one of the entry ports.

10. The sample chamber holder of claim 8 wherein a thermocouple is connected to at least one of the entry ports.

11. The sample chamber holder of claim 8 wherein at least one of the entry ports is connected to a gas flow manifold.

12. The sample chamber holder of claim 1 further comprising a bit piece configured to fit and lock on to an NMR drive shaft.

13. A sample chamber holder for MAS-NMR capable of operating at both low and high pressures the sample chamber holder comprised of:
   a sample holder body having an upper body portion and a lower body portion held in sealing connection, the lower portion configured to connect with a rotor holder, and further comprises viewing windows defined within the chamber body, said windows positioned and configured to enable observation of an NMR rotor cap while the NMR rotor cap is opened or closed; the upper body of the chamber defining at least one entry port that enable passage of materials into and out of the chamber; and
   a magnetically coupled capscrew driver mechanism comprising three hollow nesting cylindrical components;
   a first hollow cylindrical component positioned external to the other two components;
   a second hollow cylindrical component adapted to fit within the first hollow cylindrical component; and a third hollow cylindrical component adapted to fit within the second hollow cylindrical component;

an inner wall of the first cylindrical component having a magnetic mechanism configured to interact with a magnetic component of the third hollow cylindrical component so as to enable magnetic coupling, whereby rotation of the first hollow cylindrical component will cause rotation of a third hollow cylinder component, the first hollow cylindrical component also connected to a second hollow cylindrical component;

the second hollow cylindrical component having a portion adapted for threaded connection with an upper body portion of a sample holder to allow coupling and sealing of the sample chamber to the sample chamber holder;

the third hollow cylindrical component configured to rest suspended in the center of the second hollow cylindrical component, the magnetic coupling of the first and third hollow cylindrical components such that a rotation in one will stimulate rotation in the other through the other cylinder, each of the first and second hollow cylindrical components also adapted to receive and allow passage of a drive shaft therethrough, the third hollow cylindrical component having a portion adapted to connect to a drive shaft, whereby rotation of the first hollow cylindrical component will turn the magnetically-coupled internal third hollow cylindrical component and thus engage the drive shaft which will manipulate an NMR rotor cap.

14. The sample chamber holder of claim 13 wherein a pressure relief device is connected to at least one of the entry ports.

15. The sample chamber holder of claim 14 wherein a thermocouple is connected to at least one of the entry ports.

16. The sample chamber holder of claim 15 wherein at least one of the entry ports is connected to a gas flow manifold.

17. The sample chamber holder of claim 16 further comprising a bit piece configured to fit and lock on to an NMR drive shaft.

* * * * *